US011155921B2

(12) United States Patent
Schmauder et al.

(10) Patent No.: US 11,155,921 B2
(45) Date of Patent: Oct. 26, 2021

(54) DEVICE AND METHOD FOR VACUUM COATING

(71) Applicant: BÜHLER ALZENAU GMBH, Alzenau (DE)

(72) Inventors: Torsten Schmauder, Egelsbach (DE); Ludger Urban, Freigerich (DE); Wilfried Dicken, Wächtersbach (DE); Jutta Trube, Mömbris (DE)

(73) Assignee: BÜHLER ALZENAU GMBH, Alzenau (DE)

( * ) Notice: Subject to any disclaimer, the term of this patent is extended or adjusted under 35 U.S.C. 154(b) by 597 days.

(21) Appl. No.: 15/774,135

(22) PCT Filed: Nov. 7, 2016

(86) PCT No.: PCT/EP2016/076811
§ 371 (c)(1),
(2) Date: Jun. 12, 2018

(87) PCT Pub. No.: WO2017/077106
PCT Pub. Date: May 11, 2017

(65) Prior Publication Data
US 2018/0327902 A1    Nov. 15, 2018

(30) Foreign Application Priority Data

Nov. 5, 2015  (DE) ...................... 10 2015 119 037.0

(51) Int. Cl.
*H01J 37/32* (2006.01)
*C23C 16/458* (2006.01)
*C23C 16/50* (2006.01)

(52) U.S. Cl.
CPC ........ *C23C 16/4587* (2013.01); *C23C 16/458* (2013.01); *C23C 16/50* (2013.01);
(Continued)

(58) Field of Classification Search
None
See application file for complete search history.

(56) References Cited

U.S. PATENT DOCUMENTS 5,424,905 A    6/1995  Nomura et al.
8,460,522 B2 *  6/2013  Oishi ................. H01J 37/3408
                                                        204/298.2
(Continued)

FOREIGN PATENT DOCUMENTS

WO    2007021520 A1    2/2007
WO    2008049634 A1    5/2008
(Continued)

OTHER PUBLICATIONS

Chinese Official Action (dated Sep. 17, 2019) for corresponding Chinese App. 201680078034.
(Continued)

*Primary Examiner* — Jason Berman
(74) *Attorney, Agent, or Firm* — WRB-IP LLP

(57) ABSTRACT

An apparatus for the vacuum treatment of substrates in a vacuum chamber includes a substrate support device with a pylon which can be rotated about a longitudinal axis and has holding means for substrates and a plasma discharge device assigned to the pylon. The plasma discharge device includes more than two plate-shaped electrodes having excitation areas, the excitation areas of which are all oriented in the direction of the pylon and a power supply device for the excitation of a plasma discharge, by at least one electrical voltage applied to at least two of the electrodes, is provided, the excited plasma acting at least on parts of the pylon and on substrates that can be arranged on them. A process performs the vacuum coating by the apparatus.

28 Claims, 6 Drawing Sheets

(52) U.S. Cl.
CPC .. *H01J 37/32018* (2013.01); *H01J 37/32403* (2013.01); *H01J 37/32568* (2013.01)

(56) References Cited

U.S. PATENT DOCUMENTS

| | | | |
|---|---|---|---|
| 8,652,588 B2 | 2/2014 | Teer et al. | |
| 2010/0247928 A1* | 9/2010 | Teer | C03C 17/30 428/446 |
| 2015/0107517 A1* | 4/2015 | Hasebe | C23C 16/452 118/723 E |
| 2015/0299847 A1* | 10/2015 | Hirota | C23C 16/486 134/1.1 |

FOREIGN PATENT DOCUMENTS

| | | |
|---|---|---|
| WO | 2013034411 A1 | 3/2013 |
| WO | 2015067665 A1 | 5/2015 |

OTHER PUBLICATIONS

Indian Official Action (dated Oct. 31, 2019) for corresponding Indian App. 201847020803.
Chinese Official Action (20-06-04) for corresponding Chinese App. 201680078034.X.
International Search Report (dated Feb. 13, 2017) for corresponding International App. PCT/EP2016/076811.
Chinese Official Action (20-09-04) for corresponding Chinese App. 201680078034.X.
European Official Action (dated Aug. 13, 2021) for corresponding European App. 16.791 044.7.

* cited by examiner

DEVICE AND METHOD FOR VACUUM COATING

BACKGROUND AND SUMMARY

The invention relates to an apparatus and a process for the vacuum treatment of substrates.

Plasma CVD systems with a plasma CVD discharge device are often used in installations for coating reflectors with aluminium as a reflective layer, in order to produce a protective layer, for example of plasma-polymerized hexamethyldisiloxane (HMDSO), on the aluminium.

For example, EP 1 947 211 A1 discloses batch-type installations for vacuum coating, wherein, for the metallization of the substrate, arranged in the vacuum chamber are an evaporator coating device and also a plasma CVD discharge device—in the two documents respectively designed differently in details—for applying the plasma-polymerized protective layers and a number of planetary substrate holders rotating about a central axis. The plasma CVD discharge device consists in this case of a pair of plate electrodes, which are arranged around the rotating workpiece holders. Because of the great space requirement of the substrate holders, in this case only a relatively long batch time in the range of greater than 10 minutes can be achieved.

Furthermore, DE 10 2010 032 591 A1 discloses an apparatus for the vacuum coating of substrates with a first pylon, which can be rotated about a first axis and has holding means for substrates. In this case, to increase the productivity, at least a second substrate support device, assigned to the evaporator array, is provided with a second pylon, which can be rotated about a second axis and has holding means for substrates.

Further batch installations with a much shorter batch time are likewise known—for instance 4-5 minutes in the case of sputtering installations of the applicant's PylonMet type.

In the case of these installations, the plasma CVD process step is the longest single process, and so it appears to be particularly desirable for this to be speeded up.

The documents US 2006/0124455 A1, U.S. Pat. No. 5,750,207 A, DE 197 54 82 A1, U.S. Pat. No. 8,101,246 B2, JP H06-45097 A and DE 296 00 991 U1 respectively disclose plasma PVD installations with multiple magnetron electrode configurations, in which substrates that are made to pass close by the magnetron electrodes are exposed to a plasma treatment.

Systems with magnetron electrodes are not suitable for plasma treatment of 3D substrates, as they must necessarily be located at a small distance from the substrate surface during treatment. The physically technical background of this necessary requirement is that magnetic fields with the distance to the electrode quickly decrease. This also reduces the plasma density. During the coating of 3D parts, this results in strong fluctuations in layer thicknesses, which are absolutely undesirable.

It is desirable to provide an apparatus and a process in which a plasma treatment of 3D substrates can be performed with high quality, a short batch time and high productivity while involving little effort.

The apparatus according to an aspect of the invention for the vacuum treatment of 3D substrates in a vacuum chamber comprises a substrate support device for 3D with a pylon which can be rotated about a longitudinal axis and has holding means for substrates and comprises a plasma CVD discharge device assigned to the pylon suitable and adapted for vacuum treatment of 3D substrates.

A pylon is the term used in this text to refer to an elongated columnar framework. The longitudinal axis of the pylon is preferably arranged vertically, with respect to the vacuum chamber as a reference system. A plate-shaped electrode is understood hereinafter as meaning a sheet-like component of a metal material which, when connected to an electrical power supply, is suitable for generating a plasma discharge. The electrodes have excitation areas, which are preferably elongated in the direction of the longitudinal axis of the pylon. An excitation area is the term used here to refer to the area that is in contact with the plasma during excitation of the plasma discharge. The excitation areas may be planar or curved. The electrodes and the excitation areas of the plasma CVD discharge device are assigned to the pylon in such a way that substrates held on it are exposed to at least part of the plasma generated by the electrodes in the vacuum chamber during operation of the apparatus.

The plasma power is understood here as meaning the electrical power that is fed to the apparatus for plasma generation by an electrical power supply device.

The expression quality refers to parameters of the properties of the coating, in particular a layer thickness, a reflection factor and/or a colour impression.

The invention is presented below substantially from the aspect of CVD coating for 3D substrates, it being understood that the invention also includes other types of plasma treatment, such as in particular a glow treatment.

The apparatus is distinguished by the fact that the plasma CVD discharge device comprises more than two plate-shaped electrodes having excitation areas, the excitation areas of which are all oriented in the direction of the pylon and a power supply device for the excitation of a plasma discharge, by means of at least one electrical voltage applied to at least two of the electrodes is provided, the excited plasma acting at least on parts of the pylon and on substrates that can be arranged on them.

In this text, an electrode is referred to as oriented in the direction of the pylon if it is in a geometrical configuration in relation to the pylon in such a way that its excitation area can be connected by a straight line to a partial surface of the pylon. This can be graphically understood as a geometrical configuration in which the electrode is in optical visual contact with the pylon. A geometrical configuration of the electrode and the pylon is the term used to refer to their spatial arrangement, irrespective of further physical parameters that may occur during operation of the apparatus, such as gas flows. The geometrical configuration of the electrodes in relation to one another is the term used to refer w their spatial arrangement in relation to another, irrespective of further physical parameters that may occur during operation of the apparatus.

Increasing the number of electrodes has the effect of increasing the overall size of the excitation areas, that is to say the effective electrode area with respect to plasma generation, which limits the current flowing during the plasma discharge. It is therefore possible in particular to feed into the plasma the same plasma power—which determines the plasma temperature and consequently the chemical excitation of the process gas—with a higher current and consequently lower voltage. This reduces the requirements both for the insulating measures of the air-side supply lines and also of the bushings through the walls of the vacuum chamber to the electrodes. The invention corresponds to the notion that for example the overall coating rate of the workpieces is increased if, with the same plasma CVD power and quality of the coating, the time period during which the workpiece to be coated is within the visual range of the excitation area of the electrodes generating the plasma is increased.

In a further embodiment of the invention, it is provided that the plasma CVD discharge device has at least three plate-shaped electrodes, wherein a first electrode with a first excitation area, a second electrode with a second excitation area and a third electrode with a third excitation area are provided, the excitation areas all being oriented in the direction of the pylon, a power supply device for the excitation of a plasma discharge in the region between the first, second and third excitation areas by means at least of an electrical voltage applied to at least two electrodes is provided.

Alternatively, the devices distinguished by the fact that the plasma CVD discharge device has at least four plate-shaped electrodes, wherein a first electrode with a first excitation area, a second electrode with a second excitation area, a third electrode with a third excitation area and a fourth electrode with a fourth excitation area are provided, the excitation areas all being oriented in the direction of the pylon, wherein a power supply device for the excitation of a plasma discharge in the region between the first, second, third and fourth excitation areas by means at least of a voltage applied to at least two of the electrodes is provided.

It goes without saying that the invention also includes the case of more than four electrodes, problems with the packaging of the components accommodated in the vacuum chamber of the apparatus generally occurring increasingly when there are more than four electrodes. It also goes without saying that a person skilled in the art can establish an optimum position of the excitation areas of the electrodes in relation to one another and in relation to the pylon for the coating or other processing of the substrates with regard to batch time and quality, for example by trial and error or simulation.

The substrates are three-dimensional substrates, for example for applications in the automotive area, computer communication or consumer electronics, in particular of plastics material, but also of metal material or glass, which sometimes are also ordered in relatively small batches.

It goes without saying that the invention generally includes a configuration of the electrodes in which higher coating rates and the same quality of the coating of substrates are achieved with the same plasma power than in the case of a configuration of only two electrodes in an otherwise identical vacuum chamber.

One embodiment of the apparatus is distinguished by the fact that in the case of item a) the first, second and third electrodes are arranged in relation to one another in such a geometrical configuration that, with a given plasma power, the apparatus can be operated with a higher coating rate of the substrates than the maximum coating rate of the substrates with a geometrical configuration of only two members of the group consisting of the first, second and third electrodes in the vacuum chamber.

Similarly, in the case of item b) the first, second, third and fourth electrodes may be arranged in relation to one another in such a geometrical configuration that, with a given plasma power, the apparatus can be operated with a higher coating rate of the substrates than the maximum coating rate of the substrates with a geometrical configuration of only two members of the group consisting of the first, second, third and fourth electrodes in the vacuum chamber.

In a further embodiment of the invention, it is provided that the first, second and third electrodes are arranged in relation to one another in such a geometrical configuration that, for at most two members of the group consisting of the first, second and third electrodes, the excitation areas of these groups cannot be connected to one another in pairs by a geometrically straight line.

In a further embodiment of the invention, it is provided that the first, second, third and fourth electrodes are arranged in relation to one another in such a geometrical configuration that, for at most three members of the group consisting of the first, second, third and fourth electrodes, the excitation areas of these members cannot be connected to another in pairs by a geometrically straight line.

It is defined that two excitation areas are connected to one another by a straight line if this line runs through the region in which the pylon is arranged.

According to the invention, the number of electrodes of which the excitation area is oriented in the direction of the pylon is increased to at least three or four per assigned pylon, wherein, for at most two or three members of the electrodes, the respective excitation areas cannot be connected to one another by a geometrically straight line in order to achieve an increase in the overall plasma CVD coating rate of the workpieces held on the pylon. These are respectively connections between the points of the excitation areas of pairs of electrodes; for example the points of the excitation area of the first and third electrodes or the excitation area of the first and second electrodes, in each case by a straight line between these points. This aspect of the invention reflects the notion that the plasma power fed in is increased if respective parts of the excitation areas of the electrodes generating the plasma that are as large as possible are in visual contact with one another.

Defined hereinafter as the spatial region lying between two excitation areas is the region of the volume of the chamber which in a projection of the respective excitation areas onto one another is arranged between them, or is enclosed by the respective excitation areas and the areas that are formed by the straight connection of the side edges and upper edges corresponding to one another of the two excitation areas. In the spatial region lying between two excitation areas, the density of the plasma generated during operation of the apparatus is generally higher than in other regions of the vacuum chamber, at least if influences of gas flows within a vacuum chamber during operation of the apparatus are disregarded. In the case of opposing rectangular excitation areas with normals to the surface lying parallel to one another, the spatial region has a cuboidal form.

One embodiment of the apparatus is distinguished by the fact that, depending on the parameters of the desired plasma treatment of the substrates, the at least one voltage is an alternating voltage, preferably with a defined frequency, amplitude or phase, or a pulsed voltage, preferably with a defined pulse frequency or amplitude.

It is also provided that, to achieve high coating rates and high quality, in the case of item a) for at least one electrode of the group consisting of the first, second and third electrodes and in the case of item b) for at least one electrode of the group consisting of the first, second, third and fourth electrodes, the voltage or current intensity is separately controllable in a closed-loop or open-loop manner.

One embodiment of the apparatus is distinguished by the fact that, in particular to improve the homogeneity of the coating, in the case of item a) the first, second and third electrodes are arranged in relation to one another and in relation to the pylon in such a geometrical configuration that, for at least two members of the group consisting of the first, second and third electrodes, at least partial regions of the pylon with substrates that can be arranged in these regions extend in the spatial region lying between the excitation areas of the at least two members.

Alternatively, it is provided that in the case of item b) the first, second, third and fourth electrodes are arranged in relation to one another and in relation to the pylon in such a geometrical configuration that, for at least two members of the group consisting of the first, second, third and fourth electrodes, at least partial regions of the pylon with substrates that can be arranged in these regions extend in the spatial region lying between the excitation areas of the at least two members.

The spatial region lying between two excitation areas generally also includes regions of the vacuum chamber that are not filled by the pylon and substrates held by the pylon. To put it another way, it can be said that in the case of the invention it may be provided that regions of the excitation areas in which the normal to the surface of at least one of the excitation areas does not point in the direction of the pylon and substrates held on the pylon are provided. There is generally also plasma in part of the volume of the chamber in which no substrates to be coated are located. Nevertheless, as long as there are still partial regions of the pylon with substrates attached to the pylon arranged in said spatial region, the overall coating rate of the substrates increases. It goes without saying that a person skilled in the art can establish an optimum position of the excitation areas of the electrodes in relation to one another and in relation to the pylon for the coating or other processing of the substrates with regard to batch time and quality, for example by trial and error or simulation.

A further embodiment of the apparatus is distinguished by the fact that, in the case of item a) for at least one electrode of the group consisting of the first, second and third electrodes and in the case of item b) for at least one electrode of the group consisting of the first, second, third and fourth electrodes, the voltage is separately controllable in a closed-loop or open-loop manner, whereby a better adaptation of the coating plasma to the spatial and dynamic conditions of the interior of the vacuum chamber, in particular the position of the excitation areas of the electrodes in relation to another and in relation to the pylon, is achievable.

A further embodiment of the apparatus is distinguished by the fact that in the case of item a) the first, second and third electrodes are arranged in relation to one another in such a geometrical configuration that, for at least two members of the group consisting of the first, second and third electrodes, the surface normal vectors of the excitation areas are substantially perpendicular to one another. Alternatively, it is provided that in the case of item b) the first, second, third and fourth electrodes are arranged in relation to one another in such a geometrical configuration that, for at least two members of the group consisting of the first, second, third and fourth electrodes, the surface normal vectors of the excitation areas are substantially perpendicular to one another. In the case of these embodiments, a particularly high plasma density is achieved, since the ratio of the size of the excitation areas to the size of the volume lying between excitation areas is favourable.

Preferably, at least one of the excitation areas extends parallel to the longitudinal axis of the pylon or has a partial region that is arranged parallel to the longitudinal axis of the pylon.

Preferably, all or at least some of the electrodes are attached directly to the opposing chamber walls.

With four electrodes, the invention includes at least the embodiment in which the electrodes are arranged such that the first and second electrodes are arranged substantially opposite one another on one side of a plane in which the longitudinal axis of the pylon lies and the third and fourth electrodes are arranged substantially opposite one another on the other side of the plane.

Preferably, the chamber walls extend as planar areas parallel to the longitudinal axis of the pylon or have planar areas parallel to the longitudinal axis of the pylon.

A further embodiment of the apparatus is distinguished by the fact that at least one electrode is assigned to a fastening region of the vacuum chamber wall and has a shaping that corresponds to the shaping of the chamber wall in the assigned fastening region. In this case, the at least one electrode is fastened to the vacuum chamber, by fastening means that are electrically insulated with respect to the vacuum chamber, in such a way that the rear side area of this at least one electrode is at a distance from the chamber wall in the assigned fastening region of the chamber wall that is smaller than the darkroom distance during operation of the apparatus as intended.

In order to prevent the formation of parasitic plasmas in the vicinity of an electrode, it is already known per se, for example from DE 41 09 619 C1 or EP 0 502 385 B1, to choose the distance between an electrode and another object to be less than the darkroom distance.

The darkroom distance must be substantially less than the free path length in order to prevent a discharge cascade. The size of the darkroom distance is generally dependent on the potential difference between the plasma and a surface adjoining the plasma and the process gas pressure as well as further parameters. With the usual operating parameters of plasma coating devices, the darkroom distance is between 1 mm and several millimetres.

Usually, the darkroom shieldings that are used for the plate electrodes in the plasma CVD discharge devices are technically complex and increase the design, production and operating costs considerably, since the electrodes are not fastened directly to the chamber wall. As a difference from the prior art, the electrodes in the case of this embodiment do not require any separate darkroom shielding with respect to the chamber walls, since in their fastening region they follow with their rear side area the curvature of the chamber wall at a distance less than the darkroom distance. The formation of parasitic plasmas is therefore prevented almost automatically in the region of the electrode.

A further embodiment of the apparatus is distinguished by the fact that the chamber wall has in at least one assigned fastening region a planar surface and the at least one electrode has a planar rear side area.

A further embodiment of the apparatus is distinguished by the fact that at least one electrode is formed as a planar plate and the chamber wall is formed in the assigned fastening region as a planar surface. Preferred in particular is an embodiment in which at least the walls of the vacuum chamber to which the electrodes are fastened are formed in a planar manner and the electrodes are formed as planar plates or plates with a planar rear side area.

Preferably, the vacuum chamber comprises a first planar wall and a second planar wall, which is perpendicular and opposite the first wall. Preferably, the vacuum chamber is formed as a kind of box with straight walls and a rectangular base area. A base area of the vacuum chamber deviating from the rectangular form is likewise included by the invention.

A further embodiment of the apparatus is distinguished by the fact that the chamber wall has in at least one assigned fastening region a curved surface and the at least one electrode has a rear side area curved in a way corresponding to the fastening region.

It goes without saying that the curvature of the surfaces is preferably formed here concavely with respect to the longitudinal axis of the pylon, in order that good utilization of the excitation area of the electrode is possible. The terminology used here for concave is as follows: if an area lies in a vicinity of a point on the same side of the tangential plane as the reference point or an observer, then it is concavely curved in relation to the reference point or the observer. Preferred in particular is an embodiment in which at least the walls of the vacuum chamber to which the electrodes are fastened are formed as cross-sectionally circular or partly circular and the electrodes are formed as cross-sectionally circular, partly circular plates or plates with a cross-sectionally circular or partly circular rear side area.

In the case of a further embodiment of the apparatus according to the invention, at least one electrode of which the excitation area is arranged obliquely in relation to a wall of the vacuum chamber is provided. Advantageously, the excitation area of the at least one electrode is oriented in the direction of the longitudinal axis of the pylon. In comparison with the previously described embodiments of the invention, the fastening of the electrodes concerned and the formation of the means for darkroom shielding are generally more complex here.

One embodiment of the apparatus is distinguished by the fact that the pylon is additionally assigned an elongated sputtering or evaporation coating device, in particular for the metallization of substrates. An integrated treatment of substrates in batch mode, with regard to metallization and application of a protective or other functional layer within a vacuum chamber, is thereby possible.

One embodiment of the apparatus is distinguished by the fact that at least one sputtering element or sputtering device or an evaporator element of the evaporator device is arranged in a region of the vacuum chamber which in the case of item a) is arranged between two members of the group consisting of the first, second and third electrodes and in in the case of item b) is arranged between two members of the group consisting of the first, second, third and fourth electrodes.

In general, further components of the apparatus, such as for example metal evaporators or pumping discharge openings, may be advantageously arranged in regions between electrodes lying next to one another.

The following embodiments of the invention have a symmetry of the arrangement of the electrodes that is advantageous for the quality of the coating and level of the coating rate, since the electrodes are prescribed in particular advantageously determined relative distances and angular relationships with respect to the pylon.

One embodiment of the apparatus is distinguished by the fact that in the case of item a) in a projection onto a planar trigonal circular reference system arranged perpendicularly to the longitudinal axis the first electrode is arranged in the first segment, the second electrode in the second segment and the third electrode in the third segment or the first electrode is arranged in the first segment, the second electrode in the third segment and the third electrode in the second segment, wherein the segments are numbered in the clockwise direction and the reference system is also defined by a circle that circumscribes the projection of all the electrodes. The smallest radius of a circle may be chosen as the radius of a circle, so that the circle circumscribes just about the projection and also the electrodes.

Furthermore, in the case of item b) it may be provided that in a projection onto a in a planar Cartesian reference system arranged perpendicularly to the longitudinal axis, with a first, second, third and fourth quadrant, the first electrode is arranged in the first quadrant, the second electrode in the second quadrant, the third electrode in the third quadrant and the fourth electrode in the fourth quadrant or that the electrodes are arranged in one of the permutations of this arrangement, wherein the quadrants are numbered in the clockwise direction and the reference system is also defined by a square that circumscribes the projection of all the electrodes. The square may be the smallest square that circumscribes the projection of all the electrodes.

One embodiment of the apparatus is distinguished by the fact that in the case of item a) a member of the group consisting of the first, second and third electrodes has an excitation area of a size 3G that lies between $0.5*3$ G2 and $1.5*3$ G2, where 3G2 is the total area of the excitation areas of the two other members of the group.

In this case, the size 3G may be substantially equal to the size 3G2.

One embodiment of the apparatus is distinguished by the fact that in the case of item b) two or three members of the group consisting of the first, second, third and fourth electrodes have excitation areas with a total area of G, wherein G lies between $0.5*G'$ and $1.5*G'$, where G' is the total area of the excitation areas of the other members or of the other member of the group.

In this case, the size G may be substantially equal to the size G'.

One embodiment of the device is distinguished by the fact that in the case of item a) two members of the group consisting of the first, second and third electrodes are operated with alternating voltage of the same phase.

In this case it may be provided that the size of the excitation areas of the two members is equal in sum to the size of the excitation area of the other member of the group.

One embodiment of the device is distinguished by the fact that in the case of item a) two members of the group consisting of the first, second, third and fourth electrodes are operated with an alternating voltage of the same phase.

In this case, the two other members of the group may be operated with an alternating voltage of the same phase, but of a different phase than the first two members.

In this case, in a projection onto a in a planar Cartesian reference system arranged perpendicularly to the longitudinal axis, with a first, second, third and fourth quadrant, the first two members lie in the first and/or second quadrant and the two other members lie in the third and/or fourth quadrant.

Furthermore, it may be provided that, in a projection onto a in a planar Cartesian reference system arranged perpendicularly to the longitudinal axis, with a first, second, third and fourth quadrant, the first two members lie in the first and/or third quadrant and the two other members lie in the second and/or fourth quadrant.

Furthermore, it may be provided that, in a projection onto a in a planar Cartesian reference system arranged perpendicularly to the longitudinal axis, with a first, second, third and fourth quadrant, the first two members lie in the first and/or fourth quadrant and the two other members lie in the second and/or third quadrant. In this case, all of the members of the group may have excitation areas of substantially the same size.

The process according to the invention for the vacuum treatment of substrates in a vacuum chamber is distinguished by the fact that the vacuum treatment is performed by means of an apparatus according to the invention.

A further embodiment of the process is distinguished by the fact that the treatment of the substrates by a plasma CVD process is performed by means of the plasma CVD discharge device, in particular for the application of a top coating layer to metallized substrate surfaces.

The coating is performed preferably, but not exclusively or necessarily, with the following process parameters:

process gas density: $10^{}-3$ mbar bis $10^{}-2$ mbar
power ranges: 1 kW/m$^{}$2 to 8 kW/m$^{}$2 with reference to the total area of the partial electrodes
voltage range: 500 V to 5 kV peak voltage between electrodes
frequency of the alternating supply voltage: 1 Hz to 30 MHz, preferably 40 kHz The distance between the excitation area and the substrate surface preferably lies in the range of 10 cm-30 cm.

A further embodiment of the invention is distinguished by the fact that the treatment of the substrates with the aid of a glow discharge is performed by means of the plasma CVD discharge device, with which in particular a pretreatment of the substrates before the coating can be performed. The process parameters should be chosen similarly to in the case of the coating, the glow discharge preferably taking place in an atmosphere of nitrogen and/or oxygen. Generally, in the case of this treatment a pressure of between 1×10−3 mbar and 1×10−1 mbar, preferably between 2×10−2 mbar and 8×10−2 mbar, is usually provided.

BRIEF DESCRIPTION OF THE DRAWINGS

The invention is described in more detail below in drawings on the basis of exemplary embodiments and drawings, from which other aspects and advantages of the invention can be taken, even independently of the summary in the patent claims. The same or corresponding elements or components are provided with the same designations.

In a schematic representation:

FIG. 3 shows a representation of an interconnection of the apparatus according to the invention for the vacuum coating according to FIG. 2a;

FIG. 4 shows a representation of a further interconnection of the apparatus according to the invention for the vacuum coating according to FIG. 2a;

FIG. 5 shows a representation of a further interconnection of the apparatus according to the invention for the vacuum coating according to FIG. 2a.

DETAILED DESCRIPTION

Figure 1A:
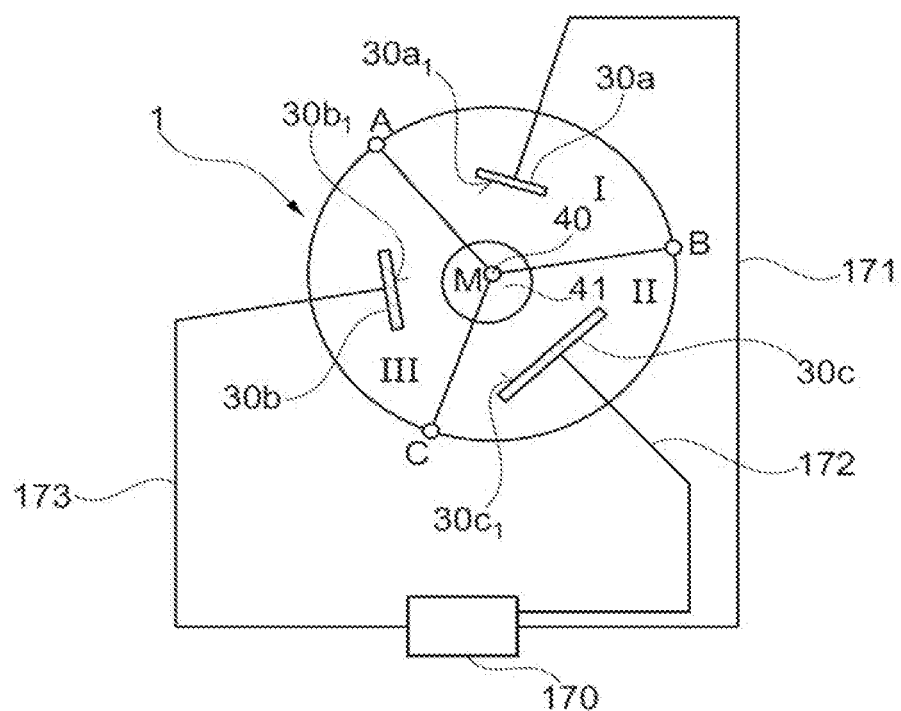
FIGS. 1a, b show in a projection onto a planar trigonal circular reference system arranged perpendicularly to the longitudinal axis of a pylon components of an apparatus according to the invention with a pylon and three electrodes.

In FIGS. 1a, b, components of an apparatus according to the invention, with electrodes 30a, 30b, 30c for two typical arrangements, are schematically represented in a projection onto a planar trigonal circular reference system arranged perpendicularly to the longitudinal axis 40 of a pylon 41 and having equally sized segments I, II, III. The segments I, II, III are defined by the radius of a circle and the points A, B, C on the line of the circle.

To simplify matters, further components of the apparatus, such as chamber walls etc., are not represented. It goes without saying that other arrangements of the electrodes are also possible; for example, arrangements in which the segments I, II, III are of different sizes.

The electrodes 30a, 30b, 30c have excitation areas 30a1, 30b1, 30c1, which are all oriented in the direction of the pylon 41.

The electrodes 30a, 30b, 32a are arranged in relation to one another in such a geometrical configuration that the excitation areas 30a1, 30b1, 32a1 are connected in pairs by a geometrically straight line. In the case of other embodiments, for at most two electrodes the respective excitation areas cannot be connected to one another by a geometrically straight line in order to achieve an increase in the overall plasma CVD coating rate of the workpieces held on the pylon. For example, two electrodes may have excitation areas aligned parallel to one another.

Figure 1B:
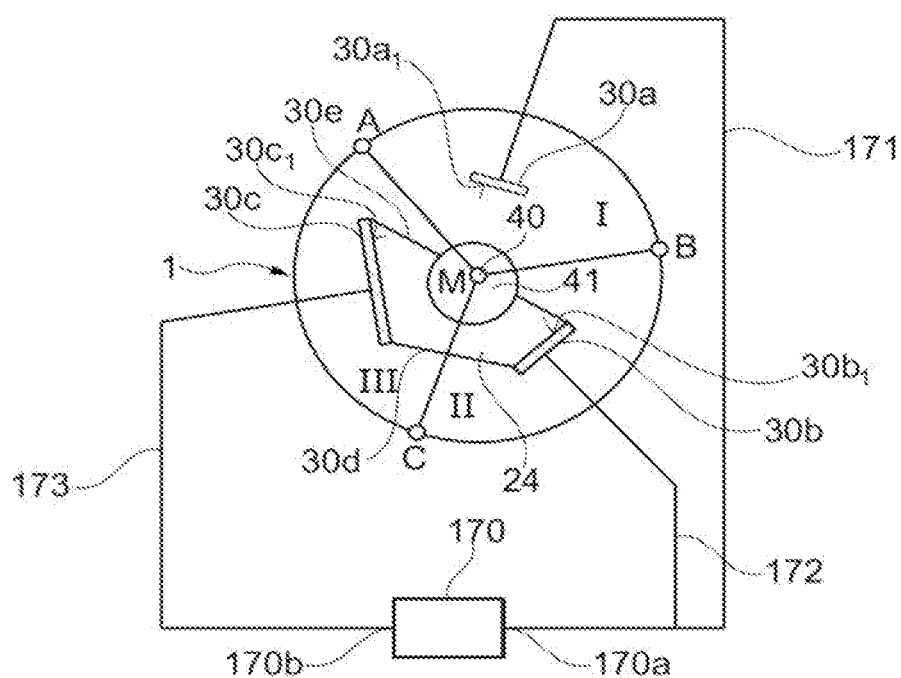
FIG. 1c shows in a projection onto a in a planar Cartesian reference system arranged perpendicularly to the longitudinal axis with components of an apparatus according to the invention with a pylon and four electrodes.

The electrodes 30a, 30b, 30c are connected by way of electrical connecting lines 171, 172, 173 to an electrical power supply 170 and are preferably operated with alternating voltage. In FIG. 1a, each electrode 30a, 30b, 30c is connected separately to the power supply. In FIG. 1b, two electrodes 30b, 30c are connected to a connection of the power supply 170. In FIG. 1b, the electrodes 30b, 30c are therefore operated with the same phase and the same amplitude.

It goes without saying that the electrodes 30a-30c in the arrangement according to FIG. 1a can be interconnected correspondingly, so that for example the electrodes 30a, 30b are operated with the same phase and amplitude. In particular in the last case it is so that: the excitation areas 30a1, 30b1 are preferably of the same or approximately the same size. The excitation area 30c1 is of a size that is preferably equal or approximately equal to the sum of the two other excitation areas 30a1, 30b1. This design of the excitation areas may however also be advantageous in the case of other arrangements of the electrodes.

Figure 1C:
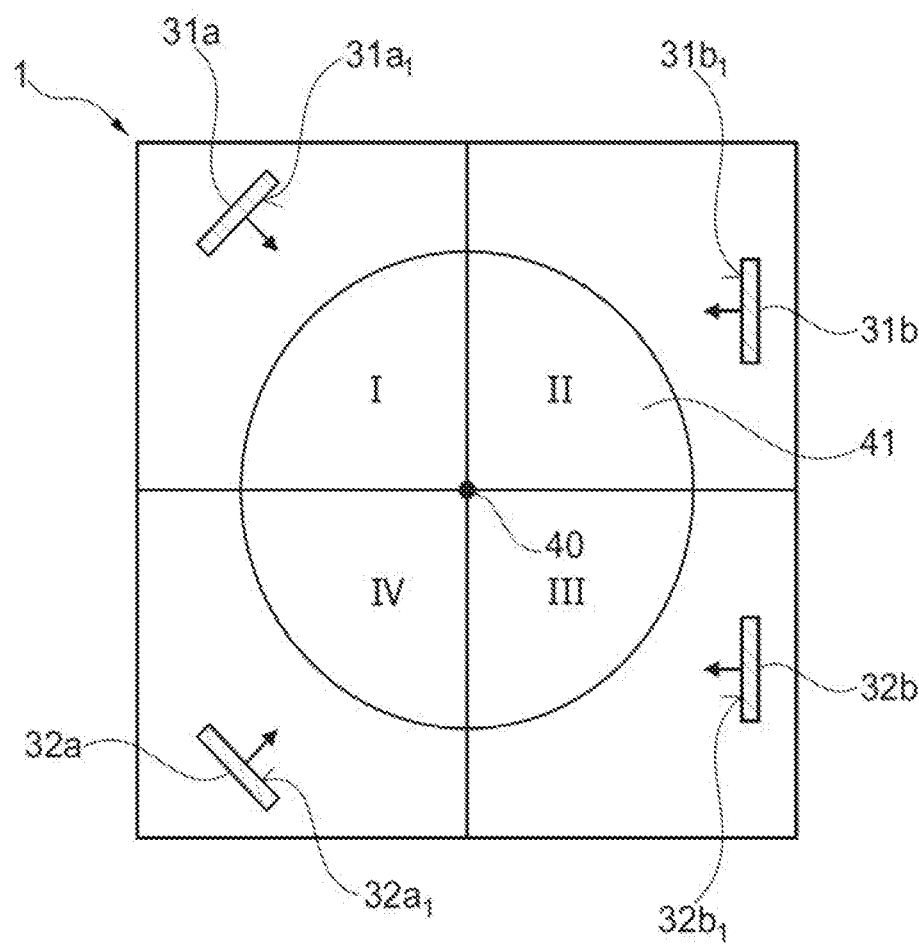

In FIG. 1c, components of an apparatus according to the invention with a pylon 41 and four electrodes 31a, 31b, 32a, 32b of a plasma CVD discharge device are represented in a projection onto a in a planar Cartesian reference system arranged perpendicularly to the longitudinal axis 40.

In the reference system, with a first, second, third and fourth quadrant I, II, III, IV, the first electrode 31a is arranged in the first quadrant I, the second electrode 31b in the second quadrant II, the third electrode 32a in the third quadrant III and the fourth electrode 32 in the fourth quadrant IV, wherein the quadrants I, II, III, IV are numbered in the clockwise direction. The reference system is a square that circumscribes the projection of all the electrodes (31a, 31b, 32a, 32b). It may also be provided that the electrodes are arranged in one of the permutations of this arrangement.

The pylon 41 is rotatable about a longitudinal axis 40. The pylon typically has a length of 150 cm to 200 cm. In FIG. 1c, for the sake of simplicity no further details of the substrate support device or any of the substrates taken up by the device are represented. Also not represented for the sake of simplicity are further components of the apparatus, such as chamber walls etc., which however are discussed in conjunction with FIG. 2a.

The electrodes are produced from a suitable metal. Preferably, the electrodes 31a, 31b, 32a, 32b are formed as planar plates, which preferably have equally or approximately equally sized excitation areas 31a1, 31b1, 32a1, 32b1, but may also be of different sizes.

The electrodes 31a, 31b, 32a, 32b extend longitudinally along the longitudinal axis 40 of the pylon 41. Preferably, the electrodes 31a, 31b, 32a, 32b extend over the entire length of the pylon 41, to the extent that substrates are held or can be held there. The electrodes 31a, 31b, 32a, 32b may also themselves be subdivided still further, it going without saying that the distances between the subdivided elements should be kept small, in order to avoid an inhomogeneity of the plasma generated.

The first electrode 31a and the second electrode 31b have excitation areas 31a1, 31b1 oriented in relation to one another, which are arranged in such a way that regions of the pylon 41 with substrates that can be arranged in these regions extend in the spatial region 25 lying between the excitation areas 31a1, 31b1 of the first electrode 31a and the second electrode 31b. Similarly, the third electrode 32a and the fourth electrode 32b have excitation areas 34a, 34b oriented in relation to one another, which are arranged in such a way that regions of the pylon 41 with substrates that can be arranged in these regions extend in the spatial region 26 lying between the excitation areas 34a, 34b of the third electrode 32a and the fourth electrode 32b.

The plasma CVD discharge device is connected by way of lines not represented in FIG. 1c to an electrical power supply for the excitation of a plasma discharge, at least in a region in which the substrate support device 41 and, during operation of the apparatus, the substrates are arranged, in order to make a plasma treatment of the substrates possible. The interconnection of the electrodes is described in the text further below.

Figure 2A:
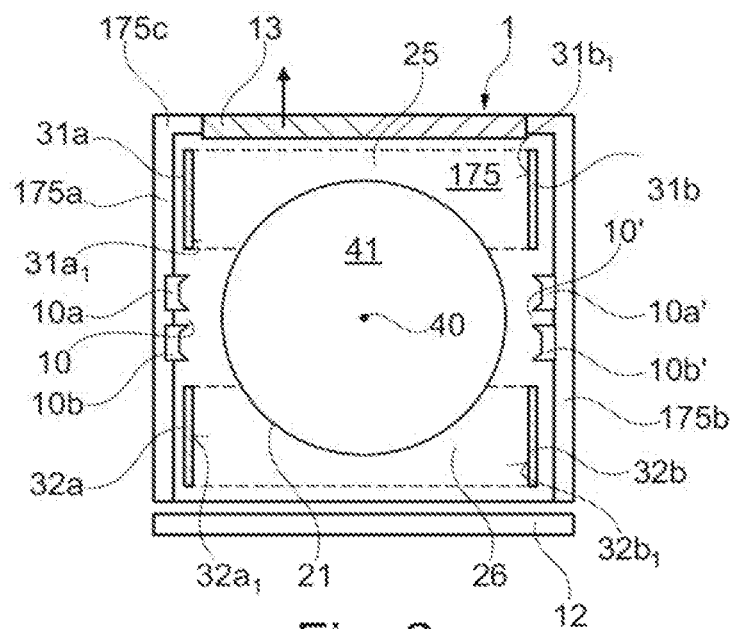
FIG. 2a shows a cross-sectional representation in a plan view with components of an apparatus according to the invention with a pylon and electrodes arranged parallel to the chamber walls and a vacuum chamber.

In FIG. 2a, an apparatus 1 for the vacuum coating of substrates in a vacuum chamber 175 with a rectangular base area is shown in a simplified representation, for example for applications in the automotive area, computers, communication or consumer electronics or the like. The substrates preferably consist of a plastics material, though other materials are also possible. The vacuum chamber 175 comprises chamber walls 175a, 175b, 175c, connections 13 for pumps being provided in the region of the chamber wall 175c. A loading door 12 is provided perpendicularly in the region of the end sides of the chamber walls 175a, 175b.

The longitudinal axis 40 of the sputtering or evaporator device 10, 10' is preferably aligned parallel to the longitudinal axis 40, it going without saying that an alignment with a small angular offset, for example of less than 10°, is also included by the invention.

The invention also includes embodiments that have substrate support devices with planetary holding means for substrates, which are rotatable about axes different from the longitudinal axis 40 about which the pylon 41 is rotatable.

The electrodes 31a, 32a and 31b, 32b are spaced apart from one another and attached to opposing chamber walls 175a and 175b, respectively.

Partial regions of the excitation areas 31a1, 31b1 extend beyond the projection of the pylon 41 onto the chamber walls 175a and 175b, respectively.

As in FIG. 1c, the plasma CVD discharge device is connected by way of lines not represented in FIG. 2a to an electrical power supply for the excitation of a plasma discharge, at least in a region in which the substrate support device 41 and, during operation of the apparatus, the substrates are arranged, in order to make a plasma treatment of the substrates possible. The interconnection of the electrodes is described in the text further below.

The plasma CVD discharge device may be designed for pretreatment of the substrate surfaces and/or for plasma coating, in particular by means of plasma CVD. In particular, an inlet for reaction gases, for example hexamethyldisiloxane (HMDSO), may also be provided.

Apart from components that are not represented, such as feeding devices for process gases, the apparatus 1 comprises sputtering devices 10, 10', which are elongated parallel to the longitudinal axis 40 and are arranged on opposing chamber walls 175a, 175b between the spaced-apart electrodes 31a and 32a and 31b and 32b, respectively. Other positions of the sputtering devices 10, 10' or of evaporation devices are likewise possible.

Instead of the sputtering devices 10, 10' represented, in the case of an evaporator apparatus elongated evaporator devices may also be provided, usually with a number of evaporator elements, arranged along a longitudinal axis that is not represented, for example arranged in the manner of a harp in a frame-like construction with elongated support elements. The evaporator elements are preferably filled with aluminium wire. When it warms up, for example as a result of an electric current being passed through, the metal evaporates, so that metal vapours emerge from the region of the evaporator array and diffuse into the surrounding space and are deposited on the workpieces.

The electrodes 31a, 31b, 32a, 32b are fastened to the vacuum chamber walls 175a, 175b by means of an electrically insulating fastening means in their assigned fastening regions. The rear side areas of the electrodes 31a, 31b, 32a, 32b are in this case at a distance from the chamber wall 175a, 175b in the assigned fastening region that is less than the darkroom distance during operation of the apparatus as intended. In the embodiment represented, the rear side areas and the fastening region are formed as planar corresponding areas. It goes without saying that embodiments with curved areas of the rear side areas and the chamber walls are also covered by the invention. Examples of this are vacuum chambers with a cylindrical or oval base area.

Figure 2B:
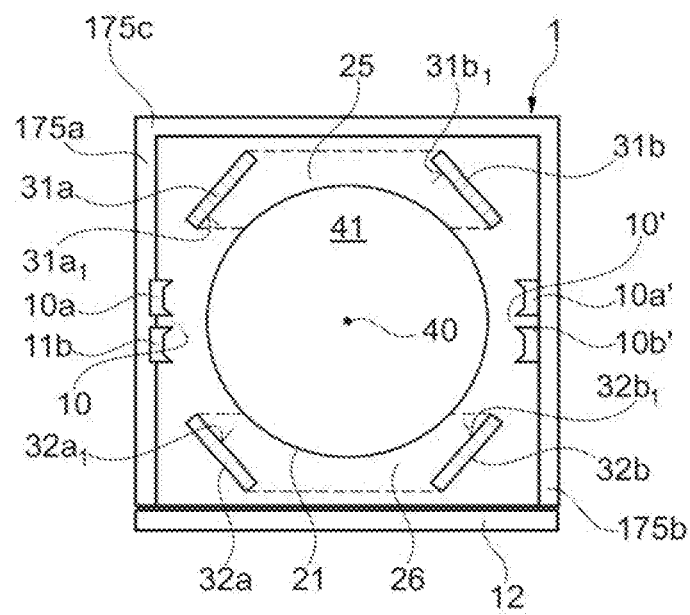
FIG. 2b shows a cross-sectional representation in a plan view with components of an apparatus according to the invention with a pylon and electrodes arranged in the corners of chamber walls and a vacuum chamber.

In FIG. 2b a further embodiment of the apparatus 1 according to the invention for the backing coating of substrates is shown in a sectional representation, with two double electrodes, comprising electrodes 31a, 31b, 32a, 32b arranged obliquely in the corners of the vacuum chamber 175, and a pylon 41 with a longitudinal axis 40. The electrodes 32a, 32b may be movable, in order to transport the pylon 41 easily into the vacuum chamber 175 or out of the vacuum chamber 175. In comparison with the embodiment of FIG. 2a, the fastening of the electrodes 31a, 31b, 32a, 32b and the formation of the means for darkroom shielding are more complex here. On the other hand, better utilization of the space available for packaging is obtained.

Figure 3:
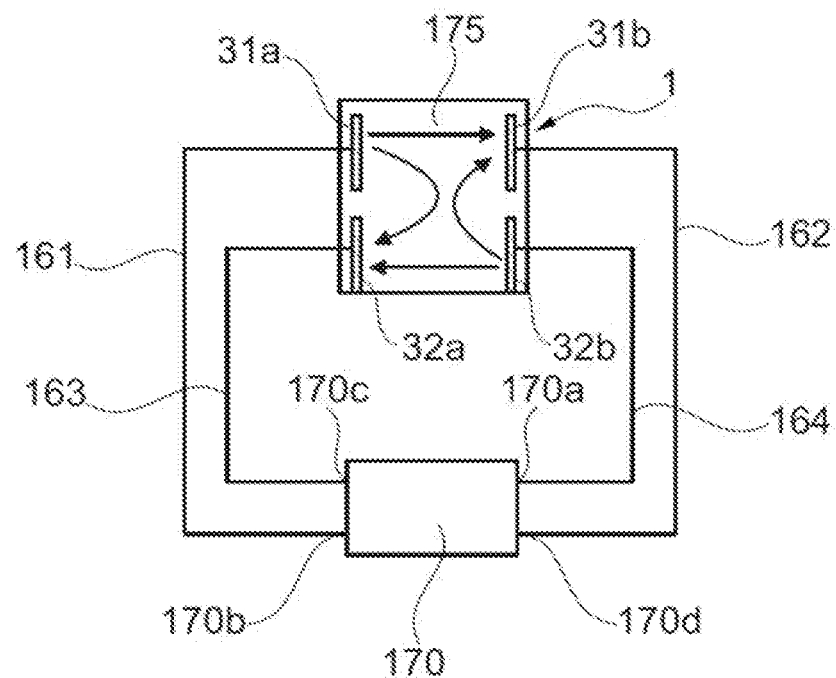
Figure 4:
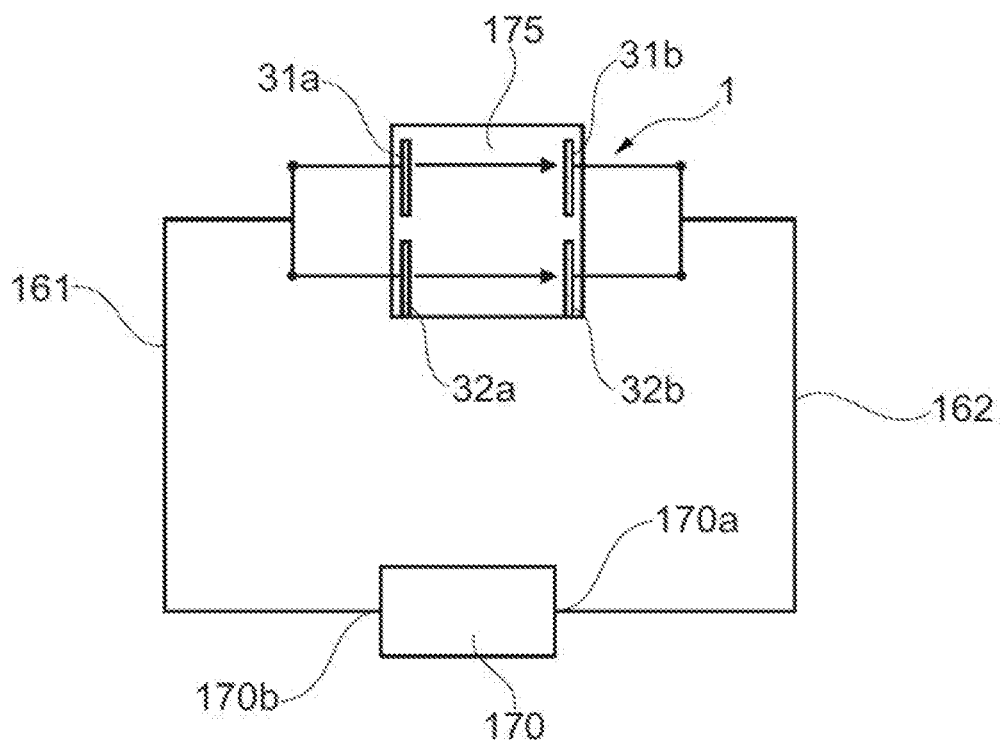
Figure 5:
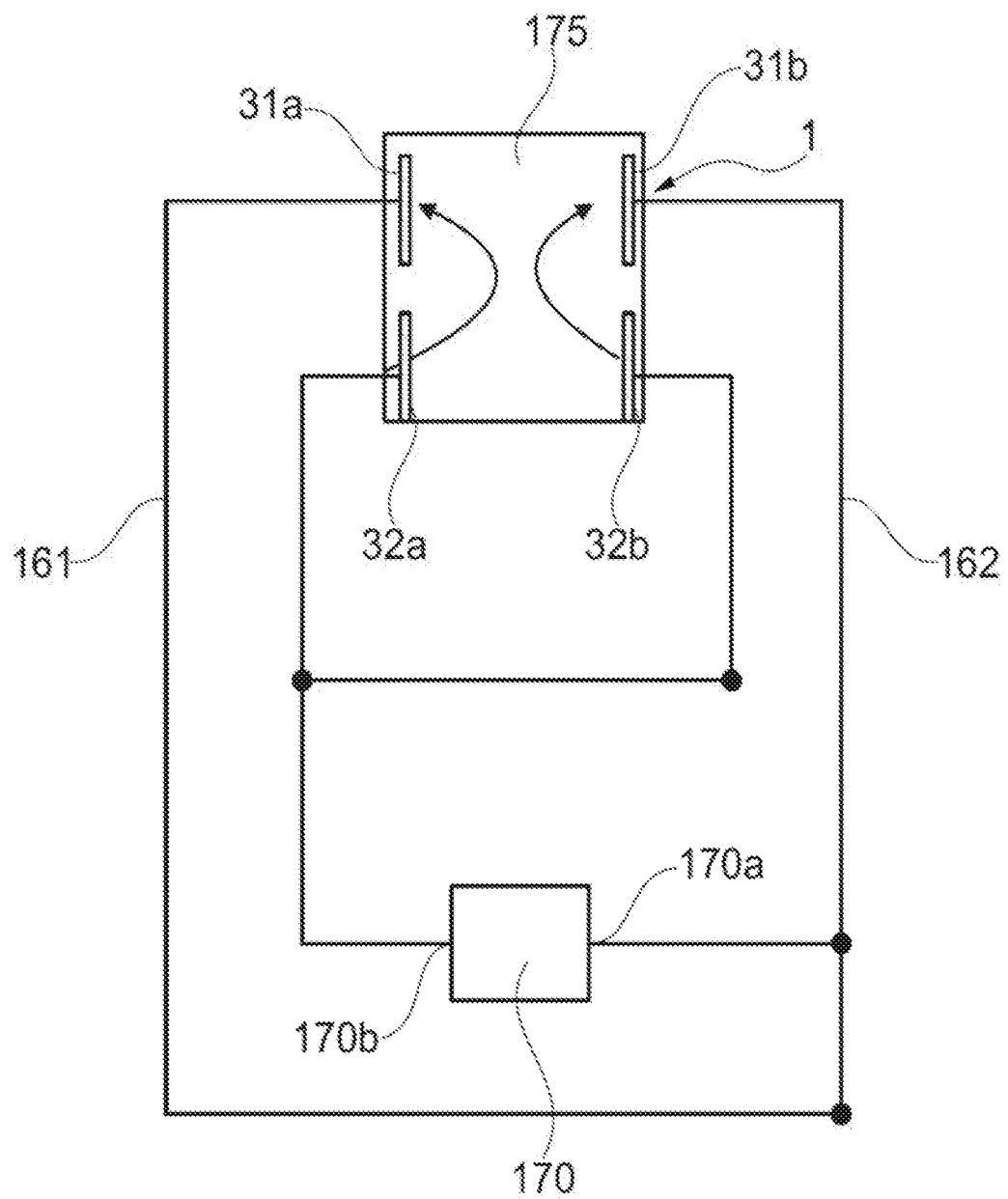

FIGS. 3-5 show representations of an interconnection of the apparatus 1 according to the invention for vacuum coating according to FIG. 2, with electrodes arranged parallel to the walls of the vacuum chamber. Also included by the invention are apparatuses with at least one electrode oriented obliquely in relation to the walls of the vacuum chamber, as represented in FIG. 2b, and also with interconnections of the electrodes as represented in FIGS. 3 to 5. Intermediate positions of the electrodes in relation to the walls, in relation to one another and in relation to the pylon are also included by the invention, according to the invention with the interconnections of the electrodes presented below.

According to FIG. 3, an electrical power supply 170 for the excitation of the plasma discharge between the electrodes 31a, 31b, 32a, 33b is provided. The excitation of the plasma discharge take place by applying at least one voltage to the first, second, third and/or fourth electrode 31a, 31b, 32a, 32b. For this purpose, the electrical power supply 170 preferably comprises one or more generators for generating electrical power, a matching network and also a transmitter for coupling the electrical power to the double electrodes. The coupling takes place by way of electrical connecting lines 161, 162, 163 and 164, which are connected to the power supply 170 and also to the electrodes 31a, 31b, 32a, 32b. Electrical voltage of a defined frequency, amplitude and phase is preferably applied to the first, second, third and/or fourth electrode 31a, 31b, 32a, 32b. Preferably, the power supply 170 is designed such that the frequency, amplitude and phase of the electrical power is separately controllable in a closed-loop or open-loop manner for each electrode 31a, 31b, 32a, 32b. Correspondingly, the electrodes 31a, 31b, 32a, 32b are connected by way of electrical connecting lines 161, 162, 163 and 164 to connections 170a-170d of the power supply 170.

As also in the case of the embodiments of the still following FIGS. 4 and 5, an interconnection of the electrodes 31a, 31b, 32a, 32b at floating potential is preferably provided, wherein therefore none of the electrodes 31a, 31b, 32a, 32b is electrically connected to earth. The electrodes 31a, 31b, 32a, 32b are therefore electrically insulated with respect to the vacuum chamber 175 or other electrical earthing points.

In FIG. 3, as also in the case of the embodiments of the still following FIGS. 4 and 5, the arrows illustrate the simplified distribution of the electrical fields in the plasma-free case and also the momentary position of the electrodes 31a, 31b, 32a, 32b in the preferred operation of the apparatus. The arrows in this case point from a location of lower potential to a location of higher potential and, in simplified terms, correspond to a direction of movement of negative charge carriers between such locations. In particular, in the representation of FIG. 3, the electrodes 31a and 32b and the electrodes 32a and 31b are operated with voltage of the same phase, optionally also the same amplitude. In this case, the electrodes 31a and 32b are connected to a common electrical connection of the power supply 170 and the electrodes 32a and 31b are connected to a common electrical connection of the power supply 170.

The electrical power supply 170 is designed in FIG. 3 in particular in such a way that the first electrode 31a is an opposite pole to the second and fourth electrodes 31b, 32b and the third electrode 32a is an opposite pole to the second and fourth electrodes 31b, 32b. In this text, an opposite pole of a first electrode is understood as meaning a second electrode that lies at a higher potential than the first electrode, in particular therefore has a different polarity. In the case of alternating voltage, this definition relates to the momentary potential or the momentary polarity at a specific point in time.

FIG. 4 shows an embodiment of the invention in which the electrical power supply 170 is designed in such a way that the electrodes 31a, 32a or 31b, 32b are operated with voltage of the same phase, optionally also the same amplitude. To put it another way, the first electrode 31a is an opposite pole to the second and fourth electrodes 31b, 32b and the third electrode 32a is an opposite pole to the second and fourth electrodes 31b, 32b.

FIG. 5 shows a preferred embodiment of the invention in which the electrical power supply 170 is designed in such a way that the electrodes 31a, 31b or 32a, 32b are operated with voltage of the same phase, optionally also the same amplitude. To put it another way, the first electrode 31a is an opposite pole of the fourth electrode 32b and the third electrode 32a is an opposite pole of the second electrode 31b.

Figure 6:
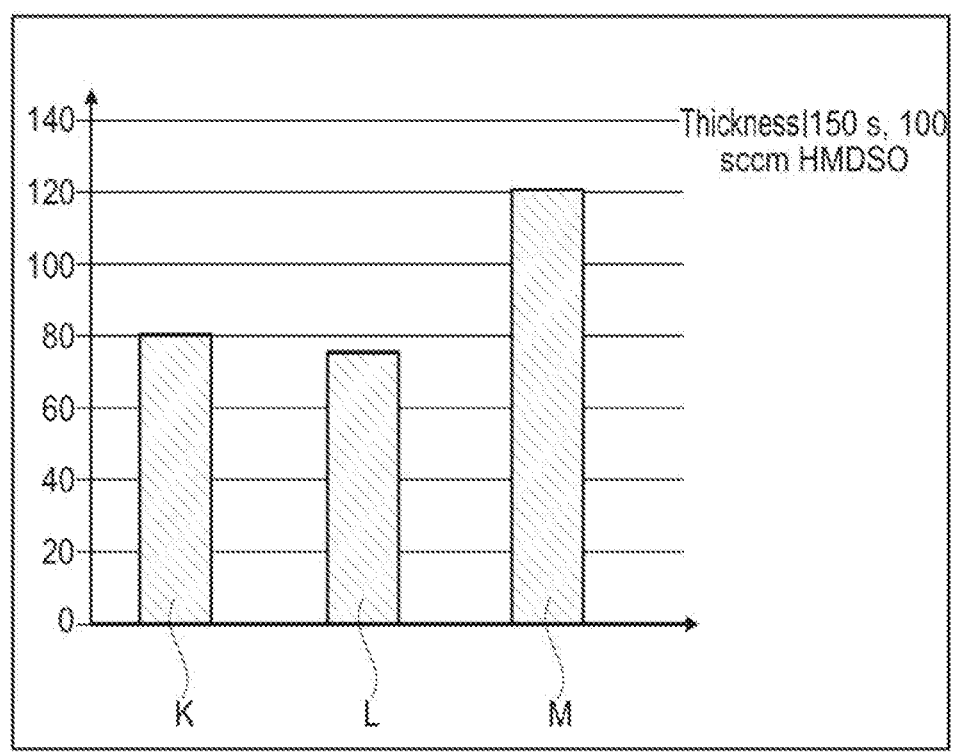
FIG. 6 shows a representation of comparative results of test coatings with various apparatuses for vacuum coating.

The invention makes a significant increase in the plasma CVD coating rate possible in comparison with existing installations when using the same amount of reactive gas and the same plasma power. In this respect, FIG. 6 shows the results K, L and M of test coatings with various apparatuses for vacuum coating, where K, L denote the results for installations with two electrodes and M denotes the results with an apparatus according to the invention with four electrodes, in an arrangement as in FIG. 2a. Shown are results for the thickness of the deposited layers for the deposition of plasma-polymerized hexamethyldisiloxane (HMDSO) on aluminium substrates with a reactive gas flow of 100 sccm HMDSO within 150 sec. and otherwise the same process parameters. The doubling of the layer thickness in the case of the invention is evident. The quality of the coating was the same in all cases.

LIST OF DESIGNATIONS

1 Apparatus
10 Sputtering coating device
10' Evaporation coating device
12 Loading door
13 Connections
21 Substrate support device
24 Spatial region
25 Spatial region
26 Spatial region
30a Electrode
30a1 Excitation area
30b Electrode
30b1 Excitation area
30c Electrode
30c1 Excitation area
30d Connecting line between edges of the electrodes 30b and 30c
30e Connecting line between edges of the electrodes 30b and 30c
31a First electrode
31a1 Excitation area
31b Second electrode
31b1 Excitation area
32a Third electrode
32a1 Excitation area
32b Fourth electrode
32b1 Excitation area
40 Longitudinal axis
41 Pylon 161 Electrical connecting line
162 Electrical connecting line
163 Electrical connecting line
164 Electrical connecting line
170 Electrical power supply
170a Connection
170b Connection
171 Electrical connecting line
172 Electrical connecting line
173 Electrical connecting line
175 Vacuum chamber
175a,b,c Chamber wall
I Partial region in the reference system
II Partial region in the reference system
III Partial region in the reference system
A, B, C Dividing points in the trigonal reference system
K, L, M Measured values of plasma coating installations

The invention claimed is:

1. Apparatus for the vacuum treatment of 3D substrates in a vacuum chamber comprising
    a substrate support device for 3D substrates with a pylon which can be rotated about a longitudinal axis and has holding means for substrates,
    a plasma CVD discharge device assigned to the pylon, the plasma CVD discharge device comprising more than two plate-shaped electrodes having excitation areas, the excitation areas of which are all oriented in the direction of the pylon,
    a power supply device for the excitation of a plasma discharge by means of at least one electrical voltage applied to at least two of the electrodes, the excited plasma acting at least on parts of the pylon and on substrates that can be arranged on them, the plate-shaped electrodes comprising a metal material which, When connected to the power supply device, generate the plasma discharge, and
    an elongated evaporation coating device arranged between the plate-shaped electrodes and assigned to the pylon for the metallization of the substrates.

2. Apparatus according to claim 1, wherein
    item a) the plasma CVD discharge device has a group of at least three plate-shaped electrodes, wherein
    a first electrode with a first excitation area, a second electrode with a second excitation area and a third electrode with a third excitation area are provided, the excitation areas all being oriented in the direction of the pylon, and
    a power supply device for the excitation of a plasma discharge, by means of at least one electrical voltage applied to at least two of the electrodes, is provided, the excited plasma acting at least on parts of the pylon and on substrates that can be arranged on them,
or
    item b) the plasma CVD discharge device has a group of at least four plate-shaped electrodes, wherein
    a first electrode with a first excitation area, a second electrode with a second excitation area, a third electrode with a third excitation area and a fourth electrode with a fourth excitation area are provided, the excitation areas all being oriented in the direction of the pylon,
    wherein a power supply device for the excitation of a plasma discharge, by means of at least one electrical voltage applied to at least two of the electrodes, is provided, the excited plasma acting at least on parts of the pylon and on substrates that can be arranged on them.

3. Apparatus according to claim 2, wherein, with respect to item a, the first, second and third electrodes are arranged in relation to one another in such a geometrical configuration that, with a given plasma power, the apparatus can be operated with a higher coating rate of the substrates than the maximum coating rate of the substrates with a geometrics Configuration of only two members of the group consisting of the first second and third electrodes in the vacuum chamber.

4. Apparatus according to claim 2, wherein, with respect to item b the first, second, third and fourth electrodes are arranged in relation to one another in such a geometrical configuration that, with a given plasma power, the apparatus can be operated with a higher coating rate of the substrates than the maximum coating rate of the substrates with a geometrical configuration of only two members of the group consisting of first, second, third and fourth electrodes in the vacuum chamber.

5. Apparatus according to claim 2, wherein in the case of item a) the first, second and third electrodes are arranged in relation to one another in such a geometrical configuration that, for at most two members of the group consisting of the first, second and third electrodes, the excitation areas of these groups cannot be connected to one another in pairs by a geometrically straight line
    or
    in the case of item b) the first, second, third and fourth electrodes are arranged in relation to one another in such a geometrical configuration that, for at most three members of the group consisting of the first, second, third and fourth electrodes, the excitation areas of these members cannot be connected to another in pairs by a geometrically Straight line.

6. Apparatus according to claim 2, wherein
    in the case of item a) the first, second and third electrodes are arranged in relation to one another and in relation to the pylon in such a geometrical configuration that, for at least two members of the group consisting of the first, second and third electrodes, at least partial regions of the pylon with substrates that can be arranged in these regions extend in the spatial region lying between the excitation areas, or
    in the case of item h) the first, second, third and fourth electrodes are arranged in relation to one another and in relation to the pylon in such a geometrical configuration that, for at least two members of the group consisting of the first, second, third and fourth electrodes, at least partial regions of the pylon with substrates that can be arranged in these regions extend in the spatial region lying between the excitation areas of the at least two members.

7. Apparatus according to claim 2, wherein the at least one voltage is an
    alternating voltage or a pulsed voltage.

8. Apparatus according to claim 2, wherein, insofar as it refers back to item a) for at least one electrode of the group consisting of the first, second and third electrodes and insofar as it refers back to item b) for at least one electrode of the group consisting of the first, second, third and fourth electrodes, the voltage is separately controllable in a closed-loop or open-loop manner.

9. Apparatus according to claim 2, wherein
    in the case of item a) the first, second and third electrodes are arranged in relation to one another in such a geometrical configuration that, for at least two members of the group consisting of the first, second and third electrodes, the surface normal vectors of the excitation areas are substantially perpendicular to one another, in the case of item b) the first, second, third and fourth electrodes are arranged in relation to one another in such a geometrical configuration that, for at least two members of the group consisting of the first, second, third and fourth electrodes, the surface normal vectors of the excitation areas are substantially perpendicular to one another.

10. Apparatus according to claim 2, wherein
in the case of item a) at least one electrode of the group consisting of the first, second and third electrodes and
in the case of item b) at least one electrode of the group consisting of the first, second, third and fourth electrodes
is assigned to a fastening region of the vacuum chamber wall and has a shaping that corresponds to the shaping of the chamber wall in the assigned fastening region,
wherein the at least one electrode is fastened to the vacuum chamber by electrically insulating fastening means in such a way that the rear side area of this at least one electrode is at a distance from the chamber wall in the assigned listening region of the chamber wall that is less than the darkroom distance during operation of the apparatus as intended.

11. Apparatus according to claim 10, wherein the chamber wall has in at least one assigned fastening region a planar surface and the at least one electrode has a planar rear side area.

12. Apparatus according to claim 10, wherein the chamber wall has in at least one assigned fastening region a curved surface and the at least one electrode has a rear side area curved in a way corresponding to the fastening region.

13. Apparatus according to claim 2, wherein an evaporator element of the evaporator device is arranged in a region of the vacuum chamber which in the case of item a) is arranged between two members of the group consisting of the first, second and third electrodes and in the case of item b) is arranged between two members of the group consisting of the first, second, third and fourth electrodes.

14. Apparatus according to claim 2, wherein in the case of item a) in a projection onto a planar trigonal circular reference system arranged perpendicularly to the longitudinal axis the first electrode is arranged in the first segment (I), the second electrode in the second segment (II) and the third electrode in the third segment (III) or the first electrode is arranged in the first segment (I), the second electrode in the third segment (III) and the third electrode in the second segment (II), wherein the segments (I, II, III) are numbered in the clockwise direction and the reference system is also defined by the smallest circle that circumscribes the projection of all the electrodes.

15. Apparatus according to claim 2, wherein in the case of item b) in a projection onto a in a planar Cartesian reference system arranged perpendicularly to the longitudinal axis, with a first, second, third and fourth quadrant (I, II, III, IV), the first electrode is arranged in the first quadrant (I), the second electrode in the second quadrant (II), the third electrode in the third quadrant (III) and the fourth electrode in the fourth quadrant (IV), or in that the electrodes are arranged in one of the permutations of this arrangement, wherein the quadrants (I, II, III, IV) are numbered in the clockwise direction and the reference system is also defined by the smallest square that circumscribes the projection of all the electrodes.

16. Apparatus according to claim 2, wherein in the case of item a) a member of the group consisting of the first, second and third electrodes has an excitation area of a size 3G that lies between 0.5* 3G2 and 1.5* 3G2, where 3G2 is the total area, of the excitation areas of the two other members of the group.

17. Apparatus according to claim 16, wherein the size 3G is substantially equal to the size 3G2.

18. Apparatus according to claim 2, wherein in the case of item b) two or three members of the group consisting of the first, second, third and fourth electrodes have excitation areas with a total area of G, wherein G lies between 0.5* G' and 1.5* G', where G' is the total area of the excitation areas of the other members or of the other member of the group.

19. Apparatus according to claim 18, wherein the size G is substantially equal to the size G'.

20. Apparatus according to claim 2, wherein in the case of item a) two members of the group consisting of the first, second and third electrodes are operated with alternating voltage of the same phase.

21. Apparatus according to claim 20, wherein the size of the excitation areas of the two members is equal in sum to the size of the excitation area of the other member of the group.

22. Apparatus according to claim 2, wherein in the case of item b) two members of the group consisting of the first, second and third electrodes are operated with alternating voltage of the same phase.

23. Apparatus according to claim 22, wherein the two other members of the group may be operated with an alternating voltage of the same phase, but of a different phase than the first two members.

24. Apparatus according to claim 23, wherein in a projection onto a in a planar Cartesian reference system arranged perpendicularly to the longitudinal axis, with a first, second, third and fourth quadrant (I, II, III, IV), the first two members lie in the first and/or second quadrant and the two other members lie in the third and/or fourth quadrant.

25. Apparatus according to claim 24, wherein in a projection onto a in a planar Cartesian reference system arranged perpendicularly to the longitudinal axis, with a first, second, third and fourth quadrant (I, II, III, IV), the first two members lie in the first and/or third quadrant and the two other members lie in the second and/or fourth quadrant.

26. Apparatus according to claim 25, wherein in a projection onto a in a planar Cartesian reference system arranged perpendicularly to the longitudinal axis, with a first, second, third and fourth quadrant (I, II, III, IV) the first two members lie in the first and/or fourth quadrant and the two other members lie in the second and/or third quadrant.

27. Apparatus according to claim 24, wherein all of the members of the group have excitation areas of substantially the same size.

28. Process for the vacuum coating of 3D substrates in a vacuum chamber, wherein the vacuum coating is performed by an apparatus according to claim 1.

* * * * *